United States Patent
Dekker et al.

[11] Patent Number: 6,104,081
[45] Date of Patent: *Aug. 15, 2000

[54] SEMICONDUCTOR DEVICE WITH SEMICONDUCTOR ELEMENTS FORMED IN A LAYER OF SEMICONDUCTOR MATERIAL GLUED ON A SUPPORT WAFER

[75] Inventors: Ronald Dekker; Henricus G. R. Maas, both of Eindhoven, Netherlands; Steffen Wilhelm Hahn, Neu Wulmstorf, Germany

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/080,784

[22] Filed: May 18, 1998

Related U.S. Application Data

[62] Division of application No. 08/576,538, Dec. 21, 1995, Pat. No. 5,780,354.

[30] Foreign Application Priority Data

Dec. 23, 1994 [EP] European Pat. Off. ............. 94203751

[51] Int. Cl.[7] .............................. H01L 29/06; H01L 23/58
[52] U.S. Cl. .......................... 257/618; 257/636; 257/637; 257/641
[58] Field of Search ....................... 257/636, 641, 257/347, 637, 618; 438/455, 406, 958

[56] References Cited

U.S. PATENT DOCUMENTS

| | | | |
|---|---|---|---|
| 4,468,857 | 9/1984 | Christian et al. | 29/637 |
| 5,087,585 | 2/1992 | Hayashi | 437/51 |
| 5,289,031 | 2/1994 | Watanabe et al. | 257/617 |
| 5,426,072 | 6/1995 | Finnila | 437/208 |
| 5,517,047 | 5/1996 | Linn et al. | 257/347 |
| 5,696,386 | 12/1997 | Yamazaki | 257/347 |
| 5,770,487 | 6/1998 | Maas et al. | 438/164 |
| 5,786,638 | 7/1998 | Yamaha | 257/641 |

FOREIGN PATENT DOCUMENTS

0570224A2 11/1993 European Pat. Off. .

*Primary Examiner*—David Hardy
*Assistant Examiner*—Jesse A. Fenty
*Attorney, Agent, or Firm*—Brian J. Wieghaus

[57] ABSTRACT

A method of manufacturing a semiconductor device which starts with a semiconductor wafer (1) which is provided with a layer of semiconductor material (4) lying on an insulating layer (3) at a first side (2). Semiconductor elements (5) and conductor tracks (14) are formed on this first side (2) of the semiconductor wafer (1). Then the semiconductor wafer (1) is fastened with this first side (2) to a support wafer (15), and material (18) is removed from the semiconductor wafer (1) from its other, second side (17) until the insulating layer (3) has been exposed. The method starts with a semiconductor wafer (1) whose insulating layer (3) is an insulating as well as a passivating layer. The semiconductor device must be provided with a usual passivating layer after its manufacture in order to protect it against moisture and other influences. In the method described here, such a passivating layer is present already before the manufacture of the semiconductor device starts.

13 Claims, 3 Drawing Sheets

SEMICONDUCTOR DEVICE WITH SEMICONDUCTOR ELEMENTS FORMED IN A LAYER OF SEMICONDUCTOR MATERIAL GLUED ON A SUPPORT WAFER

CROSS REFERENCE TO RELATED APPLICATIONS

This is a divisional of application Ser. No. 08/576,538, filed Dec. 21, 1995, now U.S. Pat. No. 5,780,354.

BACKGROUND OF THE INVENTION

The invention relates to a method of manufacturing a semiconductor device, which method starts with a semiconductor wafer which at a first side is provided with a top layer of semiconductor material situated on an insulating layer, after which semiconductor elements and conductor tracks are formed on this first side of the semiconductor wafer, the semiconductor wafer is glued with this first side to a support wafer, and material is removed from the semiconductor wafer from the other, second side until the insulating layer has been exposed.

The support wafer with the layer comprising semiconductor elements glued thereto may subsequently be subdivided into individual semiconductor devices in usual manner, which devices may comprise one or several semiconductor elements such as bipolar or field effect transistors.

The semiconductor elements in semiconductor devices thus manufactured are formed in the comparatively thin top layer of semiconductor material which is in an insulated position. Detrimental capacitances are absent, so that these devices can process signals of very high frequencies.

EP-A-570 224 discloses a method of the kind mentioned in the opening paragraph wherein the basic semiconductor wafer is a silicon wafer whose top layer situated at the first side consists of monocrystalline silicon, while the insulating layer is made of silicon oxide. This semiconductor wafer is formed by wafer bonding. In this process, two wafers of silicon are first provided with a layer of thermal oxide at one side. Then these wafers are bonded together with their oxidized surfaces under pressure and at a high temperature. Finally, one of the wafers thus bonded is subjected to a polishing and etching treatment whereby so much silicon is removed that the desired semiconductor wafer is formed.

The insulating silicon oxide layer serves as a layer at which the material-removing treatment from the second side of the semiconductor wafer stops automatically when the method mentioned in the opening paragraph is being carried out. The insulating layer, which itself is not removed during this, may then be used as an insulation for the semiconductor elements. Windows may be provided in this layer for external contacting of the semiconductor device. To protect the semiconductor device thus formed against mechanical and chemical damage which may arise during further mounting or enveloping, a usual passivating layer of a scratch-proof material, which is practically impermeable to moisture, to alkali atoms such as sodium, and to other mobile metallic impurities, should be provided on the silicon oxide layer.

While such a passivating layer is being provided, the semiconductor wafer must be heated to a temperature of between 300 and 400° C. in practice. After the semiconductor wafer has been glued to the support wafer, however, a treatment at a temperature higher than 200° C. may damage the glue connection. The provision of the passivating layer referred to above accordingly forms a problem.

SUMMARY OF THE INVENTION

The invention has for its object inter alia to improve the method mentioned in the opening paragraph to such an extent that the second side of the semiconductor wafer is provided with a usual passivating layer without the necessity of heating the semiconductor wafer to a temperature higher than 200° C. after it has been glued on the support wafer.

According to the invention, the method is for this purpose characterized in that the insulating layer of the semiconductor wafer with which the method starts is an insulating as well as a passivating layer. This insulating and passivating layer, which is exposed, insulates and protects the semiconductor elements and conductor tracks present in the semiconductor device after the method has been completed. Since this layer has been present right from the start of the method, however, the semiconductor wafer need not be heated any more for the formation of a passivating layer after the glue connection has been effected. The semiconductor wafer may accordingly be fastened on the support wafer by means of a synthetic resin glue such as an epoxy or acrylate glue.

The insulating and passivating layer may be formed by a layer of a material which is both insulating and passivating. This layer is in direct contact with the layer of semiconductor material and serves as a stopper layer in the removal of material from the semiconductor wafer. The material of the insulating and passivating layer should accordingly not only have good insulating and passivating properties, but it also must not interfere with the manufacture and the operation of semiconductor elements in the layer of semiconductor material, while it should perform satisfactorily as a stopper layer. It is difficult to choose a suitable material for this layer if all these requirements are to be met. This choice is made easier when an insulating and passivating layer is used which comprises a sub-layer of a passivating material and a sub-layer of an insulating material. Preferably, a passivating and insulating layer is even used of which the sub-layer of passivating material is bounded on either side by a sub-layer of insulating material. In these cases, a sub-layer need comply with part of the requirements mentioned above only, which renders the choice of material easier.

In a preferred embodiment of the method, the sub-layer of passivating material is bounded on either side by a sub-layer of silicon oxide. The sub-layer of passivating material is then preferably formed by a layer of silicon nitride or a layer of phosphorus glass, or by a dual layer comprising a layer of silicon nitride and a layer of phosphorus glass. A usual layer of silicon nitride or phosphorus glass forms a layer which is practically impermeable to moisture, alkali atoms such as sodium, and other mobile metallic impurities. The one layer of silicon oxide present below the layer of semiconductor material ensures that the manufacture and operation of semiconductor elements in the layer of semiconductor material is not interfered with. When the passivating layer comprises, for example phosphorus, the silicon oxide sub-layer prevents this phosphorus from diffusing towards the layer of semiconductor material. The other silicon oxide sub-layer acts as a stopper layer, for example as an etching stopper layer when silicon is etched in a KOH etching bath during the removal of material from the semiconductor wafer.

The semiconductor wafer with which the method starts may be formed, for example, by ion implantation. Ions may be implanted, for example, into a layer situated at some distance from the surface, which ions together with silicon form an insulating and passivating material. It is only possible in practice to realize insulating and passivating layers of small thickness in this manner, which thickness may be insufficient for some applications if the above requirements are to be met. Preferably, therefore, the method starts with a semiconductor wafer which is obtained by wafer bonding. In this process, a first silicon wafer is provided at one of its sides consecutively with a layer of silicon oxide, a layer of a passivating material, and a layer of silicon oxide, after which a second wafer is provided with a layer of silicon oxide at one of its sides. Then the two wafers are bonded together with their sides on which the layers were provided. The thicknesses of the layers formed on the two wafers may be chosen substantially freely then. Preferably, the layer of passivating material on the first silicon wafer is formed by a layer of silicon nitride or a layer of phosphorus glass, or by a dual layer comprising a layer of silicon nitride and a layer of phosphorus glass.

The invention will be explained in more detail below by way of example with reference to a drawing, in which:

DESCRIPTION OF THE PREFERRED EMBODIMENTS

Figure 1:
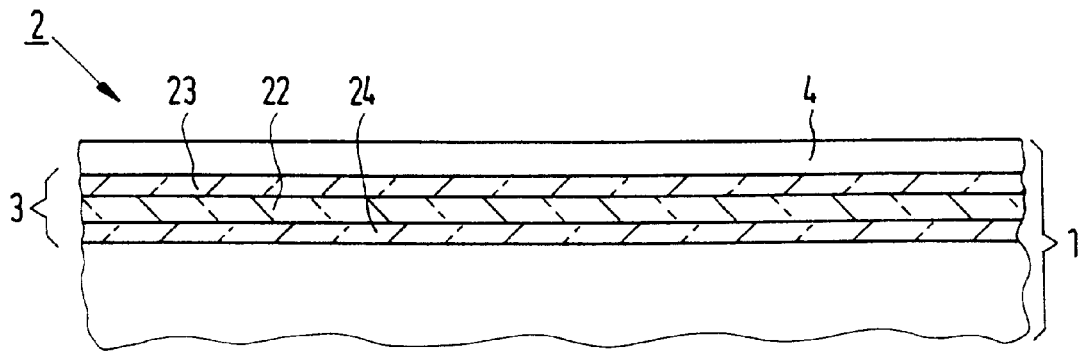
FIGS. 1 to 6 diagrammatically and in cross-section show a portion of a semiconductor device in a few stages of its manufacture by the method according to the invention, and FIGS. 7 to 9 diagrammatically and in cross-section show a few stages in the manufacture of a semiconductor wafer with which the method shown in FIGS. 1 to 6 starts.
Figure 2:
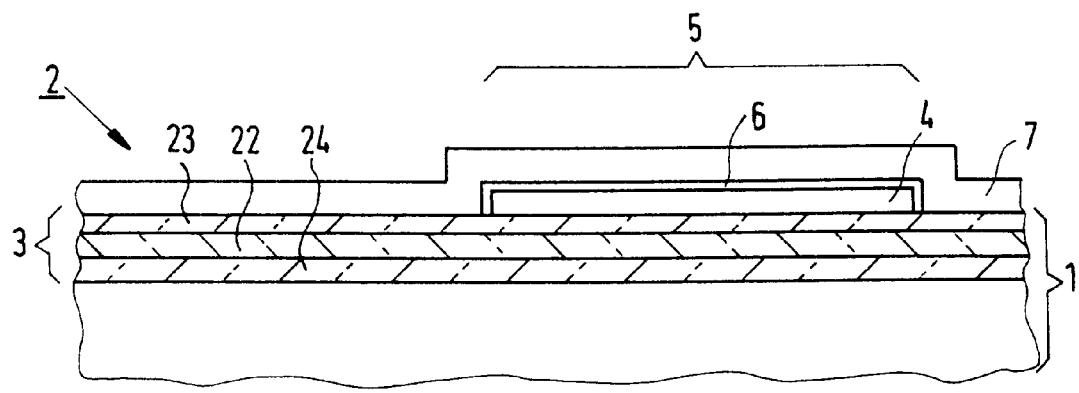
Figure 3:
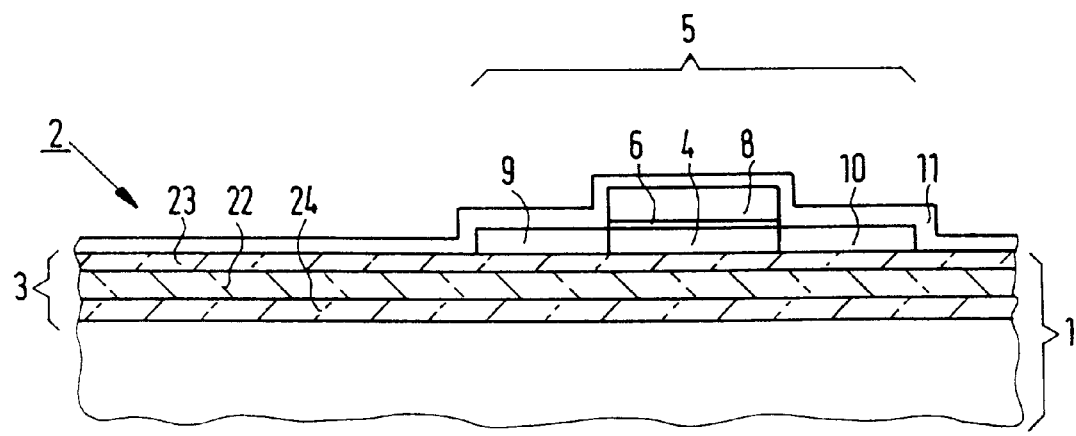
Figure 4:
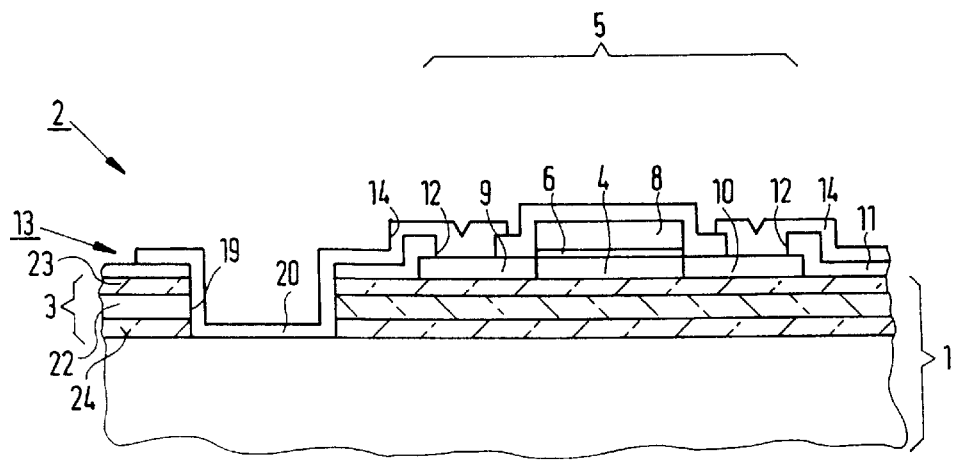
Figure 5:
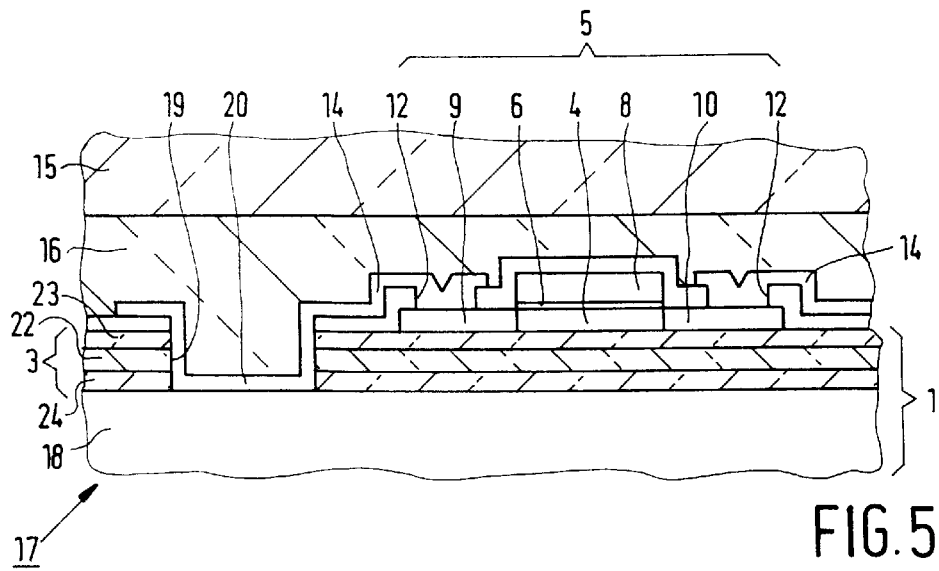
Figure 6:
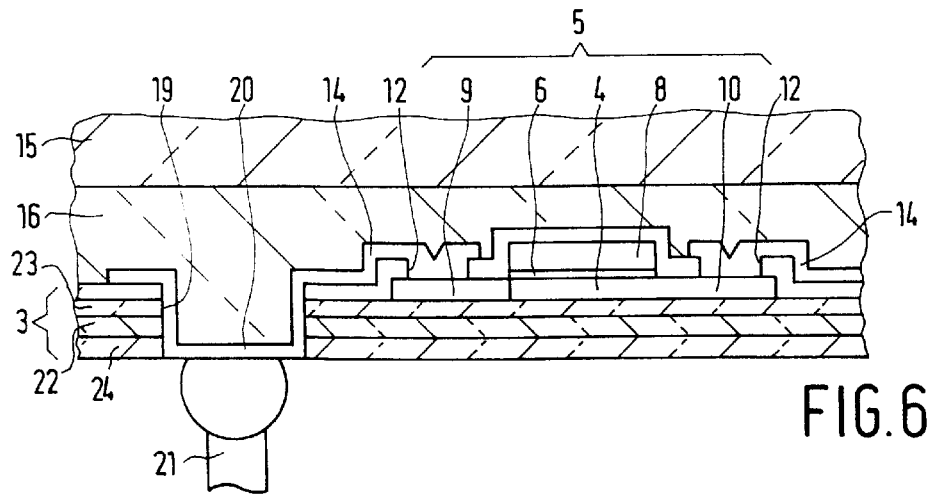

FIGS. 1 to 6 diagrammatically and in cross-section show a portion of a semiconductor device in a few stages of its manufacture by the method according to the invention. The method starts with a semiconductor wafer 1 which has at its first side 2 an approximately 1 $\mu$m thick top layer of semiconductor material 4, in this example a top layer of monocrystalline silicon, disposed on an insulating layer 3.

Semiconductor elements are formed on the first side 2 in usual manner. These may be various elements such as field effect transistors and bipolar transistors. The provision of a single element in the form of a field effect transistor is shown in this example for the sake of clarity. The top layer 4 is for this purpose provided with a p-type doping in usual manner and subsequently subdivided into mutually insulated islands 5, in this example in that the top layer 4 of silicon is etched away from between the islands 5 of the insulating layer 3. A field effect transistor is formed in each of these islands. To achieve this, the silicon top layer 4 is provided with a layer of gate dielectric 6 through a usual thermal oxidation of the silicon top layer 4. Then a layer of polycrystalline silicon 7 is deposited in which a gate electrode 8 is formed. With the gate electrode 8 as a mask, source 9 and drain 10 are subsequently formed through implantation of an n-type dopant. Finally, the transistor thus formed is covered with an insulating silicon oxide layer 11.

Contact windows 12 are provided in the silicon oxide layer 11, after which conductor tracks 14 are formed in a conducting layer 13 on the first side 2 of the semiconductor wafer 1 in usual manner.

After the conductor tracks 14 have been formed, the semiconductor wafer 1 is fastened with its first side 2 to a support wafer 15. In the present example, the semiconductor wafer 1 is fastened on an approximately 1.5 mm thick glass support wafer 15 by means of a layer of acrylate glue 16.

After the semiconductor wafer 1 has been fastened to the support wafer 15, material 18 is removed from the semiconductor wafer from the other, second side 17 until the insulating layer 3 has become exposed. For this purpose, the second side 17 is first subjected to a usual chemical mechanical polishing treatment until the insulating layer 3 has been approached up to a few tens of $\mu$m, after which this layer 3 is exposed in a KOH etching bath. The etching treatment stops automatically the moment the layer 3 is reached, this layer acting as an etching stopper layer.

The insulating layer 3 is provided with contact windows 19 in which conductive elements 20 are provided which are connected to the semiconductor elements, in the drawing to the source 9 of the transistor. The contact windows 19 and the conductive elements 20 are formed from the first side 2 of the semiconductor wafer 1 before the latter was fastened to the support wafer 15. In this example, the contact windows 19 are formed in the insulating silicon oxide layer 3 in the same photolithographical process step in which also the contact windows 12 are formed in the silicon oxide layer 11. The conductor tracks 14 and the conductive elements 20 may also be formed by means of a single photolithographical process step.

After the insulating silicon oxide layer 3 has been exposed from the second side 17 of the semiconductor wafer 1, the conductive elements 20 provided in the contact windows 19 have also been exposed. The semiconductor elements, in the example the field effect transistor, may then be contacted by means of these exposed conductive elements 20. This is effected in the example by means of a contact wire 21 provided by a usual bonding technique. It is also possible to provide an external contact on the exposed conductive elements 19 by an electroplating method.

To provide such external contact wires 21, the support wafer is subdivided into individual parts in a usual manner, for example by sawing, so that individual semiconductor devices are formed which each may comprise one or several semiconductor elements.

All process steps preceding the fastening of the semiconductor wafer 1 on the support wafer 15 may be performed in a space different from the space in which the remaining process steps are carried out. The former steps are carried out in a dust-free room or clean room, the remaining steps in a room in which the absence of dust particles is subject to less stringent requirements. As a result, the method according to the invention can be carried out comparatively inexpensively.

The insulating layer 3 of the semiconductor wafer 1 of the method is an insulating as well as a passivating layer. This insulating and passivating layer 3 which is exposed insulates and protects the semiconductor elements 5 and conductor tracks 14 present in the semiconductor device after the method has been completed. Since this layer 3 has been present right from the start of the method, however, the construction manufactured, comprising the support wafer 15, the glue layer 16 and the insulating and passivating layer 3, need not be heated any more for the formation of a passivating layer. This means that the semiconductor wafer 1 can be fastened on the support wafer 15 with a synthetic resin glue such as an epoxy or acrylate glue.

The insulating and passivating layer 3 may be formed by a layer of a material which is both insulating and passivating. This layer is in direct contact with the layer of semiconductor material 4 and serves as a stopper layer in the removal of material 18 from the semiconductor wafer 1. This means that the material of the insulating and passivating layer must not only have good insulating and passivating properties, but also must not interfere with the manufacture and the operation of the semiconductor elements in the layer of semiconductor material, while it should perform satisfactorily as a stopper layer. It is difficult to find a suitable material for this layer 3 which complies with all these requirements.

The choice is made easier when an insulating and passivating layer 3 is used which comprises a sub-layer 22 of a usual passivating material and a sub-layer of an insulating material. Preferably, a passivating and insulating layer 3 is even used whose sub-layer 22 of passivating material is bounded on either side by a sub-layer 23, 24 of insulating material. In these cases, it is sufficient for a sub-layer 22, 23 or 24 to comply with only part of the above requirements, which renders the choice of material easier.

In a preferred embodiment of the method, the sub-layer 22 of passivating material is bounded on either side by a sub-layer 23, 24 of silicon oxide. The sub-layer 22 of passivating material is then preferably formed by a usual silicon nitride layer or a layer of phosphorus glass, or by a dual layer comprising a silicon nitride layer and a phosphorus glass layer. A layer of silicon nitride or phosphorous glass is practically impermeable to moisture, alkali atoms such as sodium, and other mobile metallic impurities. The one sub-layer 23 of silicon oxide which lies below the layer of semiconductor material ensures that the manufacture and the operation of semiconductor elements in the layer of semiconductor material are not interfered with. When the passivating sub-layer comprises, for example, phosphorus, the sub-layer 23 of silicon oxide prevents this phosphorus from diffusing into the layer 4 of semiconductor material. The other sub-layer 24 of silicon oxide acts as a stopper layer, for example as an etching stopper layer when silicon is etched in a KOH etching bath during the removal of material 18 from the silicon semiconductor wafer.

Figure 7:
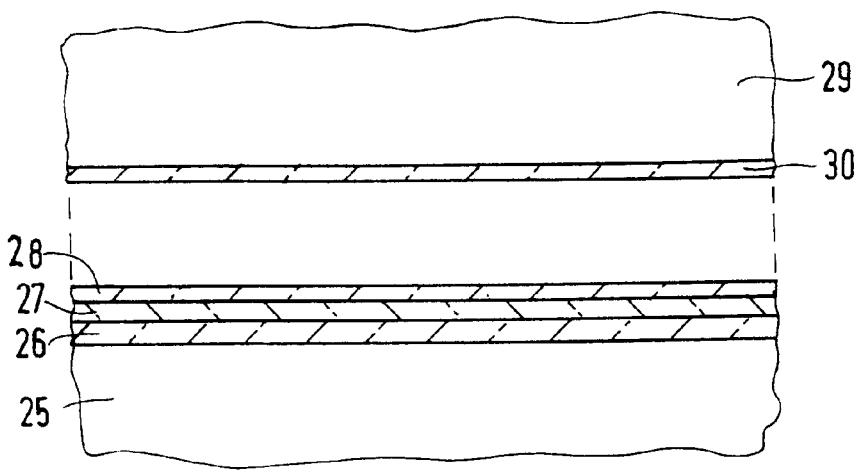
Figure 8:
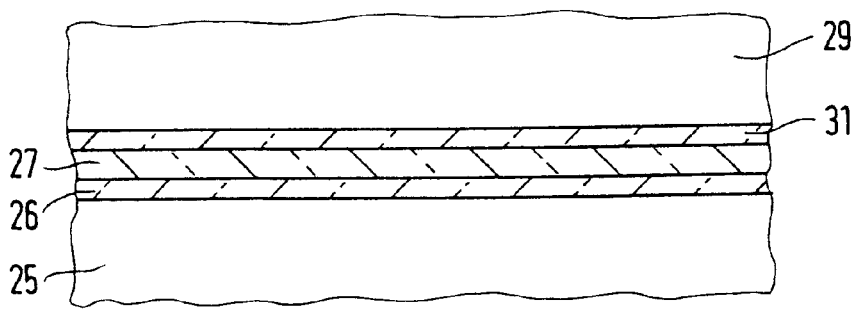
Figure 9:
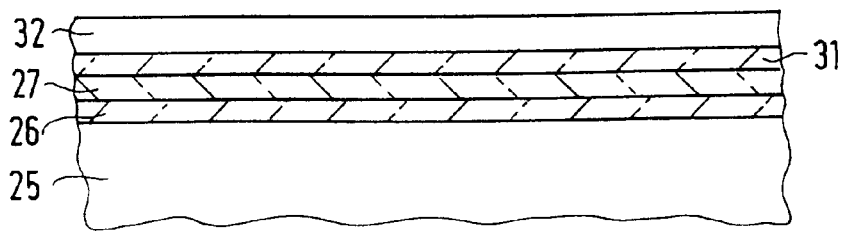

The semiconductor wafer 1 on which the method is based may be formed, for example, through ion implantation. Ions forming an insulating and passivating material with silicon may be implanted, for example, into a silicon slice into a layer situated at some distance from the surface. It is possible in practice to realize insulating and passivating layers of a small thickness only in this way, which thickness may be insufficient in some applications for meeting the above requirements. The method preferably starts, therefore, with a semiconductor wafer which is obtained by wafer bonding, see FIGS. 7 to 9. A first silicon wafer 25 is then provided at one of its sides in that order with a layer of silicon oxide 26, a layer of a passivating material 27, and a layer of silicon oxide 28, and a second wafer 29 is provided at one of its sides with a layer of silicon oxide 30. The two wafers 25 and 29 are subsequently bonded together with their sides on which the layers 26, 27, 28 and 30 were provided. The silicon oxide layers 28 and 30 form a joint silicon oxide layer 31 after that. The thicknesses of the layers formed on the two wafers may be chosen practically freely when the semiconductor wafer 1 is manufactured in this way. Preferably, the layer of passivating material 27 on the first silicon wafer 25 is formed by a usual layer of silicon nitride or a layer of phosphorus glass, or by a dual layer comprising a silicon nitride layer and a phosphorus glass layer. The silicon oxide layers 28 and 30 have a thickness, for example, of approximately 0.2 $\mu$m, the silicon oxide layer 26 a thickness of approximately 0.4 $\mu$m, while the passivating layer 27 is an approximately 0.1 $\mu$m thick layer of silicon nitride. After bonding together of the two wafers 25 and 29, one of these wafers 29 is subjected to a suitable and usual polishing treatment whereby silicon is removed until a silicon layer 32 of a desired thickness, for example of 1 $\mu$m, remains on the insulating and passivating layer 26, 27, 31.

What is claimed is:

1. A semiconductor device, comprising:
   a semiconductor wafer with a first side and a second opposite side, the wafer having at the first side thereof a first layer of semiconductor material and a second layer, the second layer having a face defining the second side of the semiconductor wafer;
   semiconductor elements and conductor tracks on said first layer of semiconductor material at the first side of the semiconductor wafer;
   a support wafer;
   the semiconductor wafer being glued permanently with said first side to the support wafer with a glue so that said semiconductor elements and conductor tracks face said support wafer,
   and the second layer of the semiconductor wafer being an insulating as well as a passivating layer and comprising a material other than silicon oxide.

2. The device as claimed in claim 1, wherein said second layer comprises a sub-layer of a passivating material and a sub-layer of an insulating material.

3. A semiconductor device according to claim 2, wherein the sublayer of passivating material is bounded on both sides by a sub-layer of insulating material.

4. A semiconductor device according to claim 2, wherein the sub-layer of passivating material is bounded on both sides by a sub-layer of silicon oxide.

5. The device as claimed in claim 4, wherein the passivating material on the first silicon wafer said second at least one of a layer of silicon nitride or a layer of phosphorus glass, or a dual layer comprising a layer of silicon nitride and a layer of phosphorus glass.

6. The device as claimed in 1, wherein the passivating material on the first silicon wafer includes at least one of a layer o silicon nitride or a layer of phosphorus glass, or a dual layer comprising a layer of silicon nitride and a layer of phosphorus glass.

7. A semiconductor device, comprising:
   a semiconductor wafer having a first side and a second opposite side, the wafer having at the first side a firs of semiconductor material situated on a second layer, said second layer being (i) electrically insulating and (ii) passivating so that it is highly scratch resistant and practically impermeable to moisture and alkali atoms;
   at least one semiconductor element in the first layer of semiconductor material;
   a support wafer facing the at least one semiconductor element; and
   a bonding agent permanently bonding the support wafer to the first layer of semiconductor material;
   at the second side of the semiconductor wafer the second, insulating and passivating layer being exposed.

8. A semiconductor device as claimed in claim 7, wherein the insulating and passivating second layer comprises a sub-layer of a passivating material and a sub-layer of an insulating material.

9. A semiconductor device as claimed in claim 8, wherein the sub-layer of passivating material is bounded on either side by a sub-layer of insulating material.

10. A semiconductor device as claimed in claim 9, wherein the sub-layer of passivating material is bounded on either side by a sub-layer of silicon oxide.

11. A semiconductor device as claimed in claim 9, wherein the sub-layer of passivating material includes at least one of a layer of silicon nitride or a layer of phosphorus glass, or a dual layer comprising a layer of silicon nitride and layer of phosphorus glass.

12. A semiconductor device as claimed in claim 7, wherein the second layer includes at least one of a layer of silicon nitride or a layer of phosphorus glass, or a dual layer comprising a layer of silicon nitride and a layer of phosphorus glass.

13. A semiconductor device as claimed in claim 7, wherein said device has a metal conductor track connected to said at least one semiconductor element, and said second layer includes a window into which said metal conductor track extends, whereby said semiconductor track may be contacted from said second side of said semiconductor wafer.

* * * * *